United States Patent
Chen

(10) Patent No.: US 10,218,320 B1
(45) Date of Patent: Feb. 26, 2019

(54) VACUUM TUBE AUDIO AMPLIFIER

(71) Applicant: ECHOWELL ELECTRONIC CO., LTD., New Taipei (TW)

(72) Inventor: Hsi-Hsien Chen, New Taipei (TW)

(73) Assignee: ECHOWELL ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/692,146

(22) Filed: Aug. 31, 2017

(51) Int. Cl.
| | |
|---|---|
| *H03F 3/181* | (2006.01) |
| *H03F 1/04* | (2006.01) |
| *G10H 3/18* | (2006.01) |
| *H03F 1/32* | (2006.01) |
| *H03F 3/02* | (2006.01) |
| *H03F 3/72* | (2006.01) |

(52) U.S. Cl.
CPC .......... *H03F 3/181* (2013.01); *G10H 3/187* (2013.01); *H03F 1/04* (2013.01); *H03F 1/327* (2013.01); *H03F 3/02* (2013.01); *H03F 3/72* (2013.01); *H03F 2200/411* (2013.01)

(58) Field of Classification Search
CPC ... H03F 3/181; H03F 1/04; H03F 1/30; H03F 1/565; H03F 1/327; G10H 3/187
USPC ............ 330/49, 70, 129, 118, 188; 381/120; 700/94
See application file for complete search history.

(56) References Cited

U.S. PATENT DOCUMENTS

| | | | | |
|---|---|---|---|---|
| 4,644,289 A | * | 2/1987 | Kennedy ................. | H03G 3/22 330/118 |
| 5,838,196 A | * | 11/1998 | Yoshizawa ............. | H03F 1/565 330/188 |
| 2010/0033245 A1 | * | 2/2010 | Arrowsmith ............. | H03F 1/30 330/129 |
| 2017/0312783 A1 | * | 11/2017 | Ahn ...................... | H03K 17/08 |

FOREIGN PATENT DOCUMENTS

CN    201590308    *  9/2010   ........... H01F 27/245

OTHER PUBLICATIONS

GMArts, Guitar Amp Basics, Jun. 18, 2017, Internet Archive Wayback Machine—https://web.archive.org/web/20170618053324/ http://www.gmarts.org/index.php?go=212, all pages/entire document pertinent.*

(Continued)

*Primary Examiner* — Paul Kim
*Assistant Examiner* — Ubachukwu A Odunukwe
(74) *Attorney, Agent, or Firm* — Locke Lord LLP; Tim Tingkang Xia, Esq.

(57) ABSTRACT

The present invention provides a vacuum tube audio amplifier which includes an audio pre-amplifying portion and an audio output transforming portion. The audio pre-amplifying portion includes an equalizer for enhanced sound quality and amplifies an audio signal, which is subsequently transmitted to the audio output transforming portion. Furthermore, the audio output transforming portion includes an audio output transformer which includes a plurality of stacked E-shaped silicon steel sheets and a plurality of (Continued)

stacked I-shaped silicon steel sheets, wherein the stacked E-shaped silicon steel sheets and the stacked I-shaped silicon steel sheets have a same height which is smaller than or equal to 48 mm.

22 Claims, 8 Drawing Sheets

(56) References Cited

OTHER PUBLICATIONS

U GMArts, Guitar Amp Basics, Jun. 18, 2017, Internet Archive Wayback Machine—https://web.archive.org/web/20170618053324/http://www.gmarts.org/index.php?go=212, all pages/entire document pertinent.*

Claire Lai, Non-Oriented Cold Rolled EL Silicon Steel Sheet for Trandsformer, Sep. 8, 2016, LinkedIn—https://www.linkedin.com/pulse/non-oriented-cold-rolled-el-silicon-steel-sheet-trandsformer-lai, all pages/entire document pertient.*

Avalon Design, VT-737sp Manual 2016, 2016, Avalon Design—http://www.avalondesign.com/manuals/Vt737sp_Manual_2016, all pages/entire document pertinent.*

* cited by examiner

VACUUM TUBE AUDIO AMPLIFIER

BACKGROUND OF THE INVENTION

Field of the Invention

The present invention relates to an audio amplifier, particularly a light-weight vacuum tube audio amplifier.

Description of the Prior Art

Vacuum tubes have excellent linear output characteristic, so conventional vacuum tube audio amplifiers that use vacuum tubes for processing audio signals can provide superior sound quality. See the circuit structure of a conventional vacuum tube audio amplifier as exemplified in FIG. 1. An audio signal enters the conventional vacuum tube audio amplifier from an audio input 1, and then is amplified through a vacuum tube audio amplifier circuit 2. However, as the operating voltage of the vacuum tube is higher, a signal has to be transformed by an audio output transformer 3 before it is output to a loudspeaker 4.

Particularly, the size of an iron core of the audio output transformer will affect the audio performance of the audio amplifier. See FIG. 2 for an example of an iron core B of the audio output transformer of the conventional vacuum tube audio amplifier, wherein the iron core B is formed of E-shaped and I-shaped silicon steel sheets, and E-shaped and I-shaped silicon steel sheets have a height a. If the size of the iron core of the audio output transformer is too small, that is, the height a is overly small, a distortion of high-frequency and low-frequency audio signals may occur as a result. Therefore, the iron core B of the audio output transformer of conventional vacuum tube audio amplifiers is composed of silicon steel sheets having a height bigger or equal to 66 mm. Therefore, traditional vacuum tube audio amplifiers are bulky, weighty and expensive, and thus do not appeal to consumers in general.

Today, as electronic technologies develop, besides conventional vacuum tube audio amplifiers, other types of audio amplifiers composed of transistors or integrated circuits, or a mixed type composed of vacuum tubes and integrated circuits have also been developed. However, current audio amplifiers still cannot retain the advantages of superior-sounding quality and low even-order harmonic distortions of traditional vacuum tube audio amplifiers as well as overcome the huge volume, weightiness, high cost and other drawbacks of the traditional vacuum tube amplifier.

Hence, in the audio amplifier market presently, conventional vacuum tube amplifiers are mostly seen in the high-end sector, and compact-sized, light-weight and inexpensive integrated circuit vacuum tube amplifiers that have lesser sound quality are more popular in the general consumer market.

SUMMARY OF THE INVENTION

In view of the above, the object of the present invention is to reduce the huge volume and weightiness of the amplifier and lower the cost, and to provide a small-sized, light-weight and less expensive vacuum tube amplifier that possesses the superior-sounding quality of a conventional vacuum tube amplifier.

To achieve the above objective, the present invention provides a vacuum tube audio amplifier that comprises an audio pre-amplifying portion and an audio output transforming portion. The audio pre-amplifying portion amplifies the input signal and transmits it to the audio output transforming portion, and the audio output transforming portion provides the output signal to a loudspeaker, wherein the audio output transforming portion includes an audio output transformer comprising a plurality of stacked E-shaped silicon steel sheets and a plurality of stacked I-shaped silicon steel sheets, wherein the stacked E-shaped silicon steel sheets and the stacked I-shaped silicon steel sheets have a same height which is smaller than or equal to 48 mm.

The following detailed explanation of various non-limiting, substantive embodiments according to the present invention together with the accompanying drawings will provide a better understanding of the above-described aspects of the present invention.

DETAILED DESCRIPTION OF THE PREFERRED EMBODIMENTS

The vacuum tube audio amplifier of the present invention aims to achieve reduction in volume, weight, and cost of the apparatus by providing a small-sized audio output transformer. While the small-sized audio output transformer causes high-frequency and low-frequency sound attenuation, the present invention further uses an equalizer for enhanced sound quality (such as, a CR-type equalizer) to correct high-frequency and low-frequency signals in order to achieve preserving superior sound effect of the vacuum tube audio amplifier.

Figure 1:
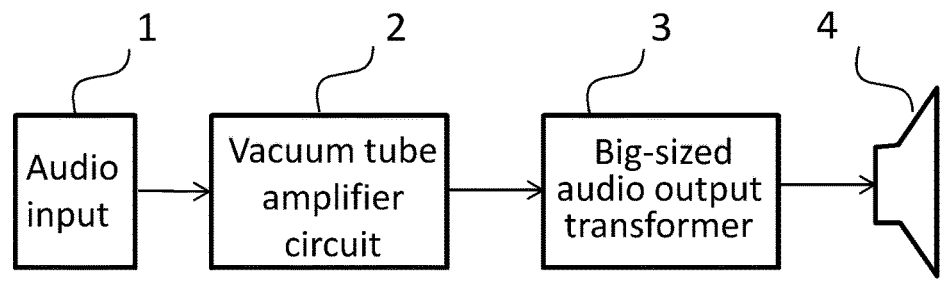
FIG. 1 is the circuit structure diagram of a conventional vacuum tube audio amplifier.
Figure 2:
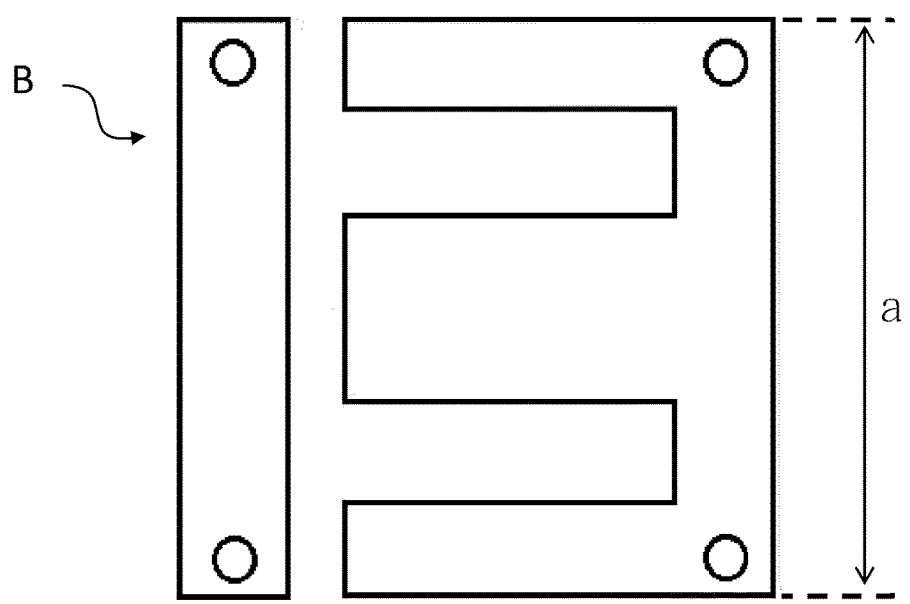
FIG. 2 illustrates the size of an iron core included in the audio output transformer of a conventional vacuum tube audio amplifier.
Figure 3:
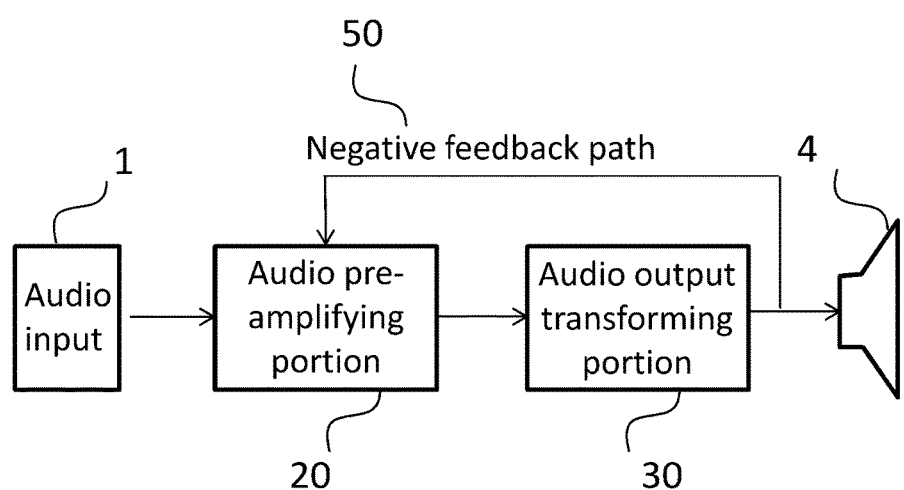
FIG. 3 is a circuit structure diagram of the vacuum tube audio amplifier in accordance with the present invention.

With reference to FIG. 3, FIG. 3 gives an example of a circuit structure diagram of the vacuum tube audio amplifier in accordance with the present invention. The vacuum tube audio amplifier of the present invention applies to providing an audio output signal according to an audio input signal. After an audio input signal enters the vacuum tube audio amplifier via audio input 1, it is amplified, filtered, and re-amplified by an audio pre-amplifying portion 20; then its power is amplified by an audio output transforming portion 30 and transformed by a small-sized audio output transformer included in the audio output transforming portion 30 to provide an audio output signal to a loudspeaker 4 to be transformed into a sound. Besides, the audio output transforming portion 30 feedbacks the signal via a negative feedback path 50 to an audio pre-amplifier to further correct the amplifying gain.

Figure 4:
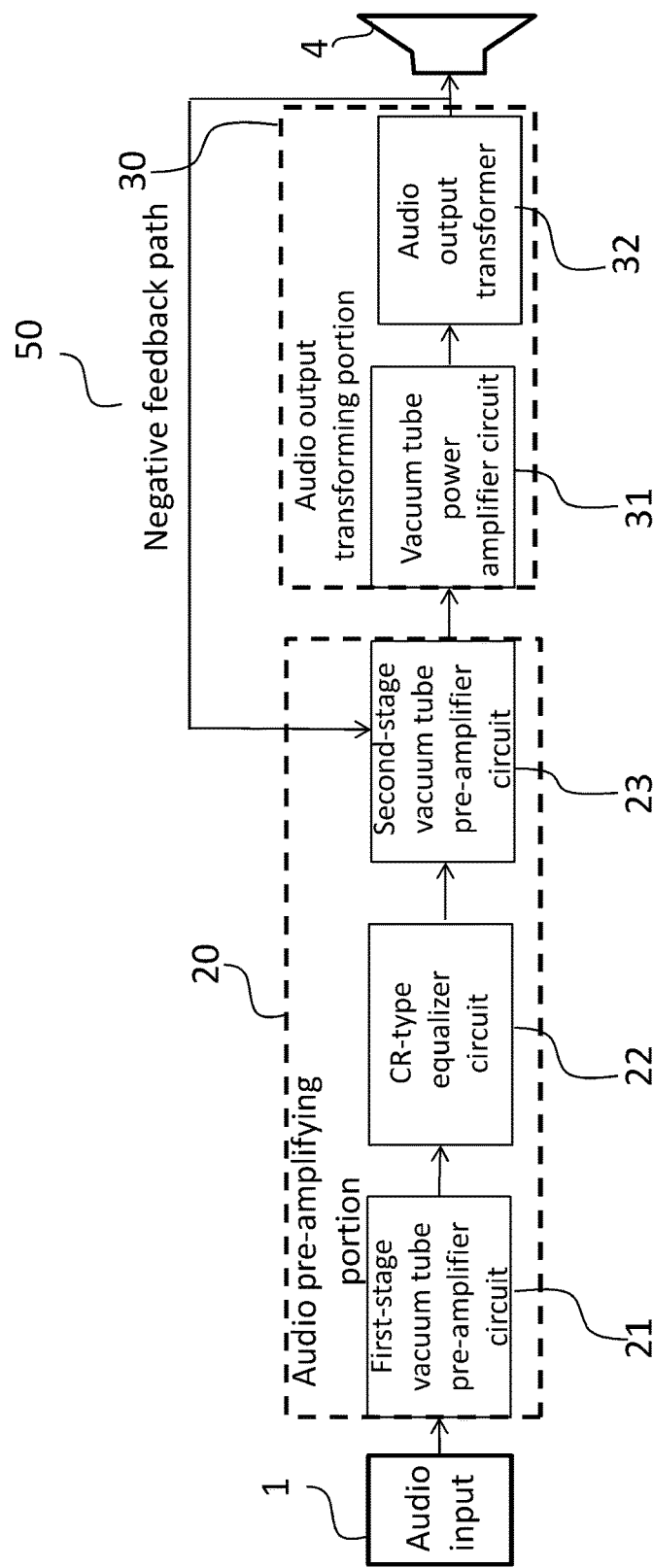
FIG. 4 is a detailed circuit structure diagram of an audio output amplifier in accordance with the present invention.

With reference to FIG. 4, FIG. 4 is an illustration of a detailed circuit structure diagram of an audio output amplifier in accordance with the present invention, wherein the audio pre-amplifying portion 20 further includes a first-stage vacuum tube pre-amplifier circuit 21, a CR-type equalizer circuit 22, and a second-stage vacuum tube pre-amplifier circuit 23. The audio output transforming portion 30 further includes a vacuum tube power amplifier circuit 31 and an audio output transformer 32.

After an audio signal enters the audio pre-amplifier portion 20 via an audio input 1, it is firstly amplified through a first-stage vacuum tube pre-amplifier circuit 21. The frequency response of the amplified signal is adjusted by the CR-type equalizer circuit 22 to enhance the gain of the high-frequency and low-frequency performance. Finally, the corrected signal is transmitted to the second-stage vacuum tube pre-amplifier circuit 23 to be amplified a second time.

After the second amplification, the signal enters the audio output transforming portion 30 and is transmitted to the vacuum tube power amplifier circuit 31 for power amplification and then transformed by the audio output transformer 32 to be provided to the loudspeaker 4 to be converted into a sound signal for output.

Moreover, as the CR-type equalizer circuit causes gain attenuation, by coordination of a negative feedback path 50 and the second-stage vacuum tube pre-amplifier circuit 23, the total gain of the audio output amplifier can be controlled; these devices can also work with other modules that are subsequently coupled thereto.

Figure 5:
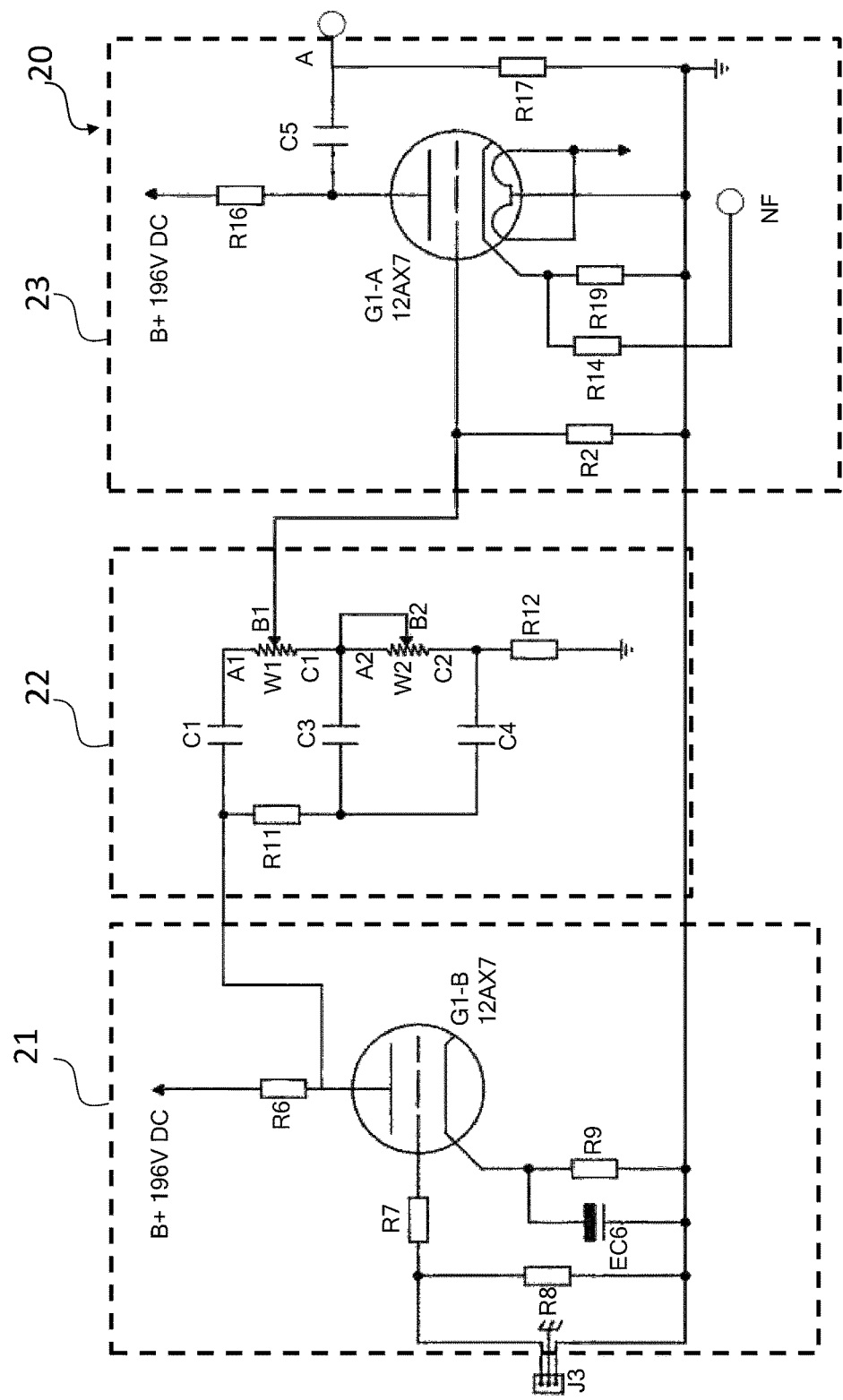
FIG. 5 is a circuit structure diagram of an audio pre-amplifying portion in accordance with the present invention.

FIG. 5 illustrates a circuit structure diagram of the audio pre-amplifying portion 20 of the present invention, which comprises a first-stage vacuum tube pre-amplifier circuit 21, a CR-type equalizer circuit 22, and a second-stage vacuum tube pre-amplifier circuit 23. A person ordinarily skilled in the art would understand that the following explanation of the circuit is merely an illustration and any circuit replacement that achieves the same goal does not depart from the scope of the present invention.

The present invention further provides an audio pre-amplifying portion 20, which may use a dual triode vacuum tube 12AX7 to constitute the first-stage vacuum tube pre-amplifier circuit 21 and the second-stage vacuum tube pre-amplifier circuit 23, respectively. See FIG. 5, the first-stage vacuum tube pre-amplifier circuit 21 includes a triode vacuum tube G1-B, a resistor R8 bridging over to an input terminal and a ground terminal, a resistor R7 bridging over from an input terminal to a grid electrode, a resistor R9 and an electrolytic capacitor EC6 bridging over from the cathode to the ground terminal, and a resistor R6 bridging over from a plate to an output terminal. Hence, after an audio signal enters into the grid electrode of the triode vacuum tube G1-B from an input terminal J3, it is output and amplified by the triode vacuum tube G1-B. Then the amplified signal enters into the CR-type equalizer circuit 22.

With reference to FIG. 5, to carry out the function of a equalizer for enhanced sound quality, the CR-type equalizer 22 includes a first capacitor C1, a second capacitor C3, a third capacitor C4, a first resistor R11, a second resistor R12, a first variable resistor W1, a second variable resistor W2, an input, and an output, wherein the input is connected to the first-stage vacuum tube pre-amplifier circuit 21; the output is connected to the second-stage vacuum tube pre-amplifier circuit 23; the input is connected to a first terminal of the first resistor R11 and a first terminal of the first capacitor C1; a second terminal of the first resistor R11 is connected to a first terminal of the second capacitor C3 and a first terminal of the third capacitor C4; the first variable resistor W1 having a center tap (which is an output) is connected between a second terminal of the first capacitor C1 and a second terminal of the second capacitor C3. A second terminal of a second variable resistor W2 and a center tap of a second variable resistor W2 are connected between the second terminal of the second capacitor C3 and a second terminal of the third capacitor C4; and the second terminal of the third capacitor C4 is connected to the first terminal of the second resistor R12; the second terminal of the second resistor R11 is connected to a signal ground terminal of the audio transformer portion 30. After a signal enters into the CR-type equalizer circuit 22 and its frequency response is corrected thereby, the corrected signal enters into a second-stage pre-amplifier circuit 23 to be amplified again.

As is described above, the vacuum tube audio amplifying portion may adopt an adjustment method, which can include correcting the high-frequency and low-frequency responses of an input signal through a CR-type equalizer circuit 22. Besides, the configuration of the first capacitor C1, the first resistor R11 and the first variable resister W1 can adjust the frequency response of the high-frequency domain; therefore, the high-frequency response of the amplified signal can be corrected by adjusting the first variable resistor W1. The configuration of the second capacitor C3, the third capacitor C4 and the second resister R12 can modify the frequency response of the medium-frequency domain; the configuration of the third capacitor C4 and the second variable resistor W2 can adjust the frequency response of the low-frequency domain. Therefore, by adjusting the second variable resistor W2, the low-frequency response of the amplified signal can be corrected.

Moreover, to clearly explain the effect and objective to be achieved by the CR-type equalizer circuit of this claimed invention, the present invention further provides the conditions of the first resistor R11=33 KΩ, the second resistor R12=18 KΩ, the first capacitor C1=250 PF, the second capacitor C3=104 PF, and the third capacitor C4=223 PF. Also, the 250 KΩ first variable resistor W1 and the second variable resistor W2 are respectively configured as shown in table 1 below, though not limited thereto:

TABLE 1

| Curve | W1 configuration | W2 configuration |
| --- | --- | --- |
| Curve A | 70% location<br>$R_{A1-B1}$ = 175 KΩ<br>$R_{B1-C1}$ = 75 KΩ | 12% location<br>$R_{A2-B2}$ = 30 KΩ<br>$R_{B2-C2}$ = 220 KΩ |
| Curve B | 100% location<br>$R_{A1-B1}$ = 250 KΩ<br>$R_{B1-C1}$ = 0 Ω | 0% location<br>$R_{A2-B2}$ = 250 KΩ<br>$R_{B2-C2}$ = 0 Ω |
| Curve C | 0% location<br>$R_{A1-B1}$ = 0 Ω<br>$R_{B1-C1}$ = 250 KΩ | 100% location<br>$R_{A2-B2}$ = 0 Ω<br>$R_{B2-C2}$ = 250 KΩ |

Figure 6:
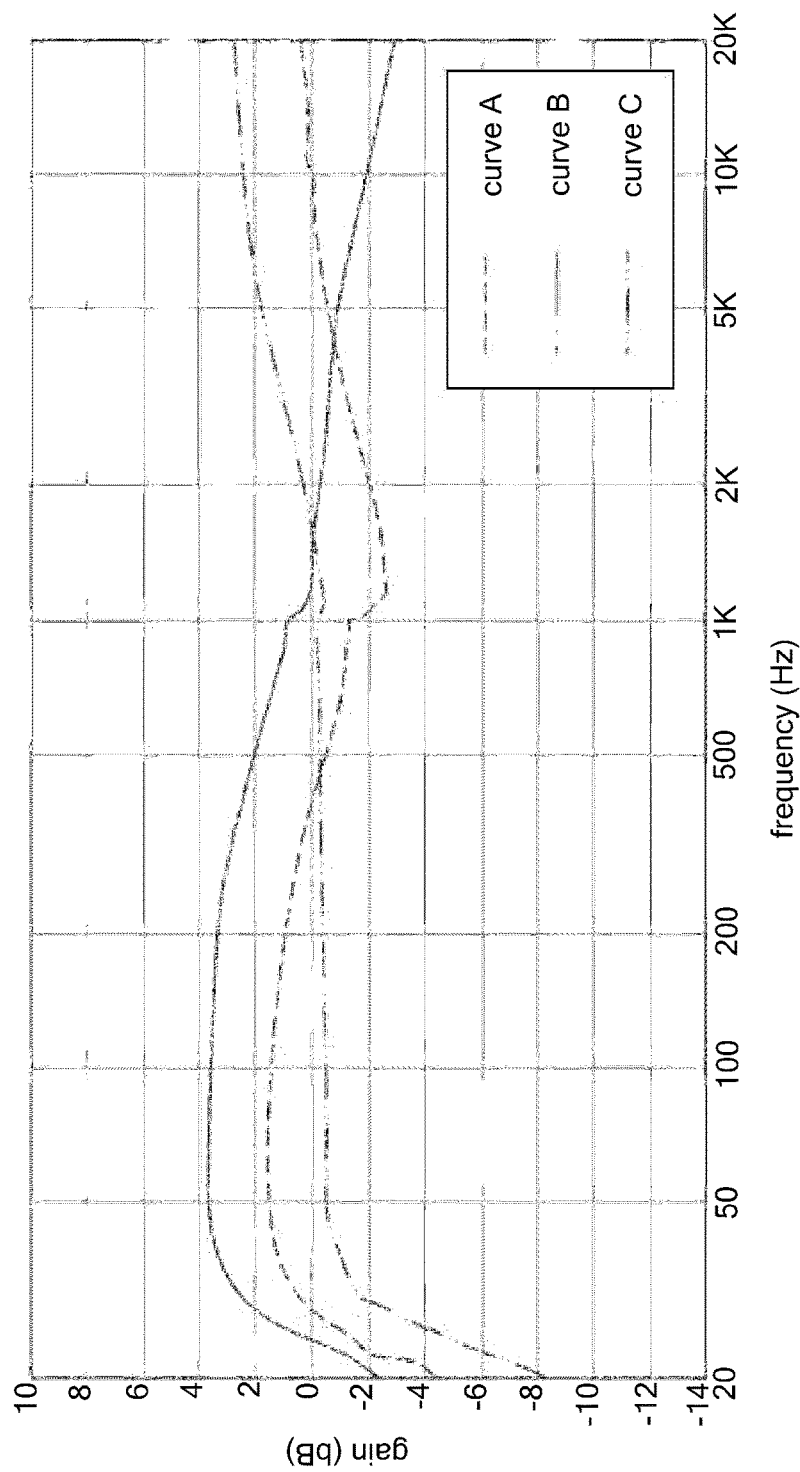
FIG. 6 is a curve diagram of the frequency response feature of a CR-type equalizer circuit in accordance with the present invention.

With the above-described configuration of the resistors and capacitors of the CR-type equalizer 22, and by adjusting the variable resistor W1 and the second variable W2 according to Table 1, a curve chart of frequency response characteristics can be obtained as FIG. 6. Within the humanly audible frequency domain of 2 kHz-20 kHz, when the first variable resistor W1 is adjusted from 0% to 100%, the 2 kHz-20 kHz high-frequency domain gain goes up from curve C to curve B; when the second variable resistor W2 is adjusted from 0% to 100%, the 20 Hz-500 Hz low-frequency domain gain goes up from curve B to curve C; alternatively, the frequency response characteristic can be adjusted to the original setting by the designer, as shown by curve A.

A person ordinarily skilled in the art would understand that the equalizer for enhanced sound quality can be but is not limited to the CR-type equalizer circuit 22, and that the CR-type equalizer circuit can be but is not limited to the circuitry of the above-described CR-type equalizer circuit 22. As long as the gain of the high-frequency and low-frequency domains can be corrected by the equalizer, it would not be deemed as departing from the scope and spirit of the present invention.

Also, the present invention can collocate with a small-sized audio output transformer according to the present invention with further configurations of various sound modes, to enable the vacuum tube audio amplifier to output sound signals with distinct qualities and allow the loudspeaker 4 to deliver different sound performances.

With reference to FIG. 5, the second-stage vacuum tube pre-amplifier circuit 23 includes a triode vacuum tube G1-A which is bridged over to the corrected signal (that is, the output of the CR-type equalizer circuit 22) and the resistor R2 at the ground terminal, a resistor R19 bridged over from the cathode of the triode vacuum tube G1-A to the ground terminal, a resistor R16 bridged over from the voltage source to the plate of the triode vacuum tube G1-A, a capacitor C5 bridged over from the plate of the triode vacuum tube G1-A to the output terminal A of the second-stage vacuum tube pre-amplifier circuit 23, and a resistor R17 bridged over from an output terminal A to the ground terminal. Hence, when the corrected signal is amplified by the triode vacuum tube G1-A and transmitted from the output terminal A to the audio output transforming portion 30, the frequency response characteristics can thereby be corrected and the signal amplified.

Figure 7:
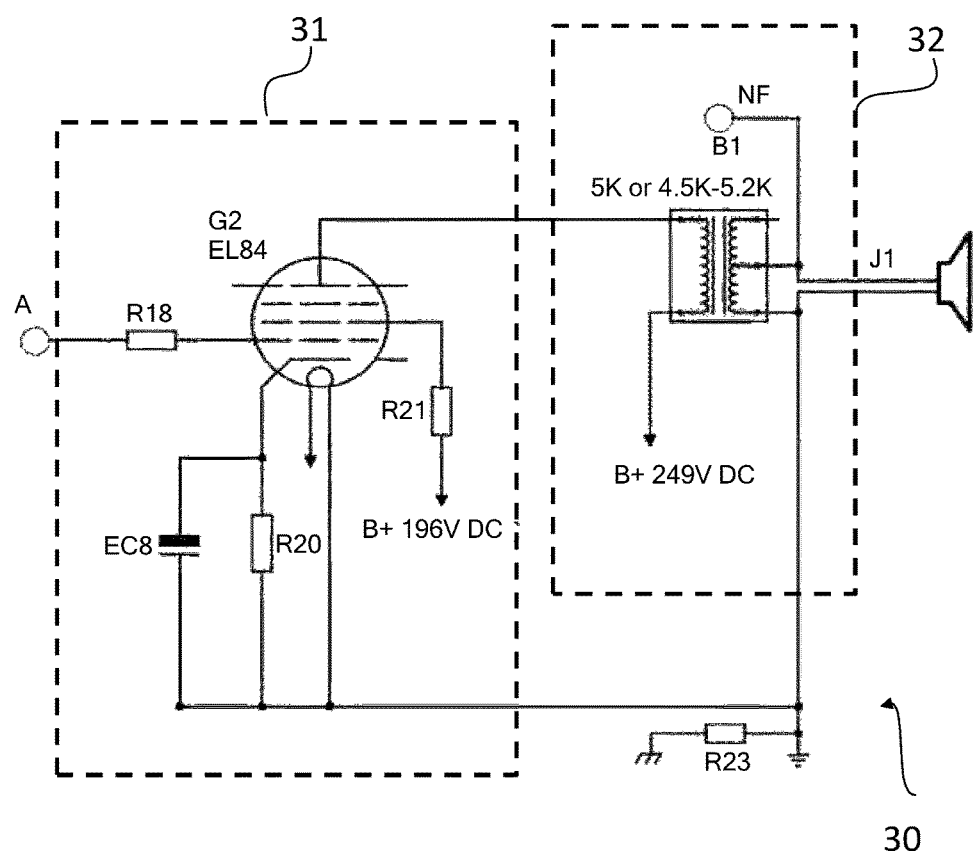
FIG. 7 is a circuit structure diagram of an audio output transforming portion in accordance with the present invention.

With reference to FIG. 7, FIG. 7 illustrates a circuit structure diagram of the present invention providing an audio output transforming portion 30 which includes a circuit diagram of a vacuum tube power amplifier circuit 31 and an audio output transformer 32. A person ordinarily skilled in the art would understand that the circuit provided in the following is merely exemplary, and any replacement of circuitry that could achieve the same goal does not depart from the scope and spirit of the present invention.

After a signal enters from the output terminal A of the audio pre-amplifying portion 20 into the audio output transforming portion 30, its power is amplified through a vacuum tube power amplifier circuit 31 consisted of a pentode vacuum tube EL84. See FIG. 7, the vacuum tube power amplifier circuit 31 comprises a pentode vacuum tube G2, a resistor R18 bridged over from the output terminal A to a grid electrode of the pentode vacuum tube G2, an electrolytic capacitor EC8 and a resistor R20 bridged over to the ground terminal from a cathode and a suppressor grid of the pentode vacuum tube G2, and a grid bias resistor R21 of the pentode vacuum tube G2. The power is amplified through the pentode vacuum tube EL84 and then be transformed in the audio output transformer 32, so as to facilitate the signal to enter the loudspeaker 4 from an output terminal J1.

Moreover, the ground terminal of the vacuum tube audio amplifier of the present invention can be coupled to the vacuum tube audio amplifier through a zero ohm resistor R23 and thus be spaced from the ground terminal.

Besides, the audio output transformer 32 comprises a negative feedback path NF, which enables the output terminal of the audio transformer 32 of the audio output transforming portion 30 to be coupled to a terminal of a resistor 14 of the second-stage pre-amplifier circuit 23 of the audio pre-amplifying portion 20 (as shown in FIG. 5). The other terminal of the resistor 14 is coupled to the cathode of the triode vacuum tube G1-A, which is used to control the total gain of the vacuum tube audio amplifier and improve the frequency response of the audio output transformer 32.

Also, the designer can based on needs adjust the parameters such as the turn number of coils, the material and dimensions of silicon steel sheets of the iron core B1 of the audio output transformer 32, in order to change the volume, weight and material of the audio output transformer 32 and thus achieve the objective of reducing its volume, weight, and the cost. In one embodiment of the present invention, the material of the iron core B1 of the present invention can be non-oriented H50 silicon steel. In another embodiment according to the present invention, the equivalent main impedance of the iron core B1 is 5K ohm or 4.5K-5.2K ohm.

Figure 8:
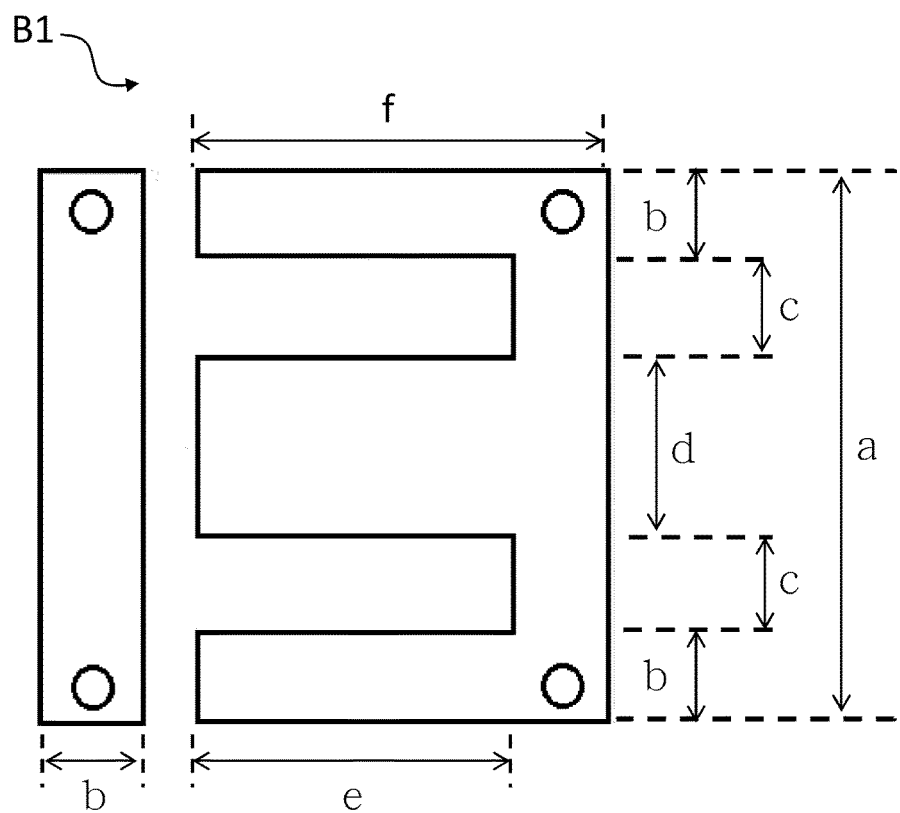
FIG. 8 is a perspective view of the E-shaped and I-shaped silicon steel sheets included in an audio output transformer in accordance with the present invention.

With reference to FIG. 8, the present invention further provides a design of the iron core B1 of the audio output transformer 32. The iron core B1 can be comprised of a plurality of stacked E-shaped silicon steel sheets and a plurality of stacked I-shaped silicon steel sheets, wherein the I-shaped silicon steel sheets and the E-shaped silicon steel sheets both have a height a; the I-shaped silicon steel sheets have a width b; the E-shaped silicon steel sheets have a width f, and the E-shaped silicon steel sheets can further have a width e and a height b, c, and d. Besides, the height a, b, c, d, and the width e and b are as shown in Table 2 below, but not limited thereto:

TABLE 2

| Type | Thickness | Size a | Size f | Size e | Size c | Size d | Size b |
|---|---|---|---|---|---|---|---|
| EI-41 H50 | 0.5 mm | 41 mm | 28 mm | 21 mm | 8 mm | 13 mm | 6 mm |
| EI-48 H50 | 0.5 mm | 48 mm | 32 mm | 24 mm | 8 mm | 16 mm | 8 mm |
| EI-66 Z11 | 0.35 mm | 66 mm | 44 mm | 33 mm | 11 mm | 22 mm | 11 mm |
| EI-76 Z11 | 0.35 mm | 76 mm | 50.8 mm | 38.1 mm | 12.7 mm | 25.4 mm | 12.7 mm |

The E-shaped silicon steel sheets and I-shaped silicon steel sheets contained in the iron core B1 of the audio output transformer 32 of the present invention have the same height a, and the same height a is smaller or equal to 48 mm can properly maintain the main impedance of iron core B1 to facilitate its collocating with the equalizer for enhanced sound quality, and can keep the frequency range in relation to the vacuum tube audio amplifier sufficient. Compared to the large-sized iron core of the conventional audio output transformer, wherein a height of the silicon steel sheets of the iron core thereof is bigger than 66 mm; therefore, the present invention can actually downsize the volume and lower the weight of the apparatus.

Moreover, compared to the conventional audio output transformer, wherein the expensive and weighty iron core uses the oriented silicon steel Z11, the present invention does not use the oriented silicon steel Z11 at high unit prices, but provides that the E-shaped silicon steel sheets and I-shaped silicon steel sheets contained in the iron core B1 of the audio output transformer 32 can be non-oriented silicon steel H50. Therefore, the vacuum tube audio amplifier of the present invention can further reduce the weight of the apparatus and the cost effectively.

As described above, the present invention, being able to downsize the volume, lessen the weight of the apparatus and lower the cost, could result in less performance by the vacuum tube audio amplifier in the high-frequency and low-frequency domains. Hence, the CR-type equalizer circuit 22 can be used to compensate for the vacuum tube audio amplifier's performance in the high-frequency and low-frequency domains, and maintain the excellent sound quality of the vacuum tube audio amplifier.

Figure 9:
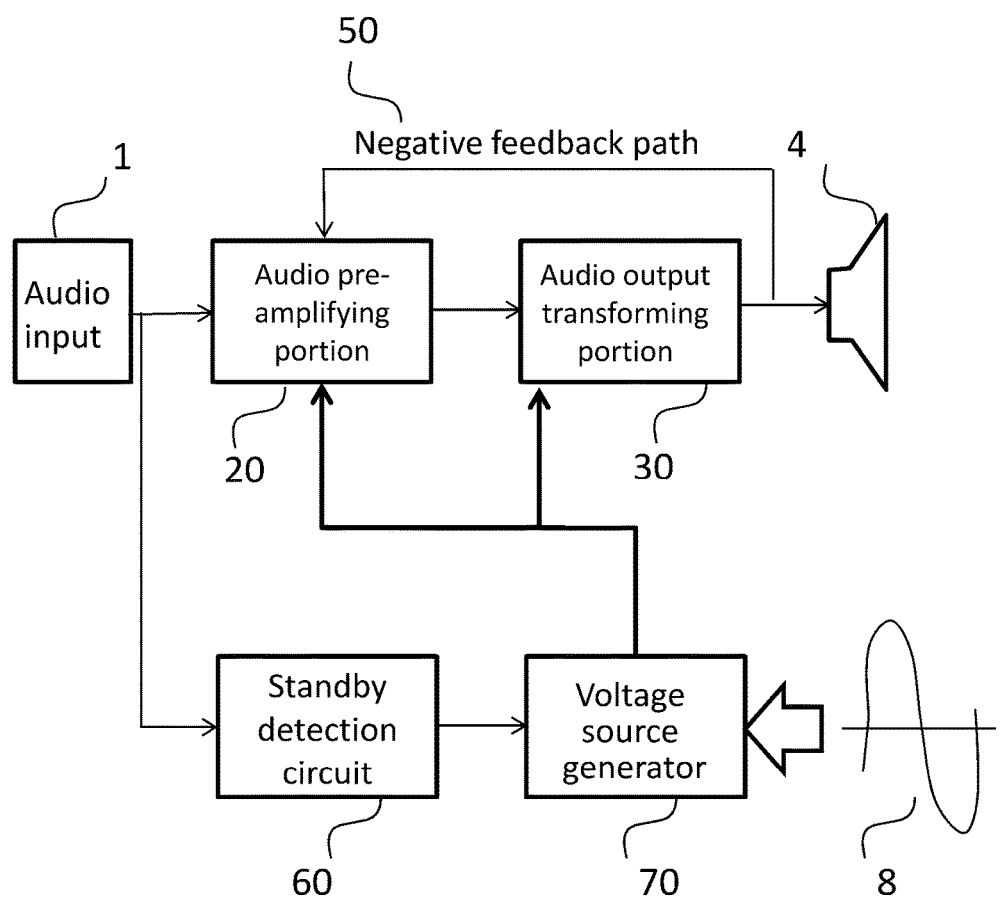
FIG. 9 is a perspective view of a vacuum tube audio amplifier circuit comprising a standby detection circuit and a voltage source generator in accordance with the present invention.

The present invention further provides that the vacuum tube audio amplifier can comprise a standby detection circuit 60 and a voltage source generator 70, which allows the vacuum tube audio amplifier to have an automated energy-saving function. With reference to FIG. 9, the standby detection circuit 60 is used to detect whether the audio signal input from the audio input 1 continues to enter the vacuum tube audio amplifier, so as to determine if the voltage source generator 70 that generates the main power supply will be turned on. In one embodiment, the multiple voltage sources provided by the voltage source generator 70 can include high-voltage source and low-voltage source.

To avoid shortening the life-span of the vacuum tube and increasing power consumption due to long standby time when the vacuum tube audio amplifier is in use, the standby detection circuit 60 can put the vacuum tube audio amplifier into a standby mode and control the voltage source generator 70 to shut down the voltage source of all or part of the circuit, and lower the standby power consumption of the vacuum tube audio transformer to below 0.5 w.

Furthermore, the voltage source generator 70 can include a micro-transformer to receive the electric supply and transform and rectify the electricity. The micro-transformer can be the only voltage source transformer unit of the vacuum tube audio amplifier that is turned on in a standby mode. In one embodiment according to the present invention, a micro-transformer can use silicon steel sheets made of oriented silicon steel Z11 for the iron core in order to lower the standby power consumption of the vacuum tube audio amplifier to below 0.3-0.35 w.

A person ordinarily skilled in the art would understand that the above description clearly discloses the objective and effect of the present invention rather than prescribe limitations thereto. Moreover, the above devices can be replaced by those having similar functions. For example, the triode vacuum tube 12AX7 may be replaced by other triode vacuum tubes such as 17AX7A, 12AU7, 6N10, ECC83, and small-sized CV triode vacuum tube by military standards. Simple replacements such as these may achieve expected effects of the present invention and do not depart from the scope whereof.

What is claimed is:

1. A vacuum tube audio amplifier for providing an output signal based on an input signal, the vacuum tube audio amplifier comprising an audio pre-amplifying portion and an audio output transforming portion, the audio pre-amplifying portion amplifying the input signal and transmitting the input signal to the audio output transforming portion, the audio output transforming portion providing the output signal to a loudspeaker, the vacuum tube audio amplifier being characterized in that:

the audio output transforming portion includes an audio output transformer comprising a plurality of stacked E-shaped silicon steel sheets and a plurality of stacked I-shaped silicon steel sheets, wherein the stacked E-shaped silicon steel sheets and the stacked I-shaped silicon steel sheets have a same height which is smaller than or equal to 48 mm, and the audio pre-amplifying portion includes an equalizer for enhanced sound quality, which corrects high-frequency and low-frequency responses of the input signal; wherein the equalizer for enhanced sound quality is a CR-type equalizer and includes an input and an output, wherein the input is connected to a first terminal of a first resistor and a first terminal of a first capacitor; a second terminal of the first resistor is connected to a first terminal of a second capacitor and a first terminal of a third capacitor; a first variable resistor having a first center tap is connected between a second terminal of the first capacitor and a second terminal of the second capacitor, the first center tap being the output a second variable resistor is connected between the second terminal of the second capacitor and a second terminal of the third capacitor, the second variable resistor having a second center tap connected to the second terminal of the second capacitor; the second terminal of the third capacitor is connected to a first terminal of a second resistor; and a second terminal of the second resistor is connected to a signal ground terminal of the audio output transforming portion.

2. The vacuum tube audio amplifier of claim 1, wherein the equalizer for enhanced sound quality corrects a high-frequency response of 2 kHz-20 kHz and a low-frequency response of 20 Hz-500 Hz.

3. The vacuum tube audio amplifier of claim 1, wherein the equalizer for enhanced sound quality is disposed between a first-stage vacuum tube pre-amplifier circuit and a second-stage vacuum tube pre-amplifier circuit.

4. The vacuum tube audio amplifier of claim 3, further comprising a feedback path, wherein the output signal provided by the audio output transforming portion is sent back to the audio pre-amplifying portion via the feedback path.

5. The vacuum tube audio amplifier of claim 3, wherein the input of the equalizer for enhanced sound quality is connected to the first-stage vacuum tube pre-amplifier circuit and the output of the equalizer for enhanced sound quality is connected to the second-stage vacuum tube pre-amplifier circuit.

6. The vacuum tube audio amplifier of claim 4, wherein the feedback path connects from a first output terminal of the audio output transforming portion to the second-stage vacuum tube pre-amplifier circuit.

7. The vacuum tube audio amplifier of claim 1, wherein the audio output transformer comprises a first output terminal and a second output terminal, the output signal is provided between the first output terminal and the second output terminal, the first output terminal is coupled to the loudspeaker and the audio pre-amplifying portion, and the second output terminal is coupled to the loudspeaker and a signal ground terminal of the audio output transforming portion.

8. The vacuum tube audio amplifier of claim 1, wherein the E-shaped silicon steel sheets and the I-shaped silicon steel sheets are non-oriented H50 silicon steel sheets.

9. The vacuum tube audio amplifier of claim 1, further comprising a voltage source generator to provide a high-voltage source and a low-voltage source to the audio pre-amplifying portion and the audio output transforming portion.

10. The vacuum tube audio amplifier of claim 9, further comprising a standby detection circuit, the standby detection circuit enabling the vacuum audio amplifier to enter a standby mode and controlling the voltage source generator to switch on or off.

11. The vacuum tube audio amplifier of claim 1, wherein the first variable resistor is used for adjusting the high-frequency response of the input signal.

12. The vacuum tube audio amplifier of claim 1, wherein the second variable resistor is used for adjusting the low-frequency response of the input signal.

13. An adjustment method for use with a vacuum tube audio amplifier, the vacuum tube audio amplifier comprising an audio pre-amplifying portion and an audio output transforming portion, the audio output transforming portion comprising an audio output transformer, the audio output transformer comprising a plurality of stacked E-shaped silicon steel sheets and a plurality of stacked I-shaped silicon steel sheets, the stacked E-shaped silicon steel sheets and the stacked I-shaped silicon steel sheets having a same height which is smaller than or equal to 48 mm, the adjustment method comprising:
  amplifying an input signal by the audio pre-amplifying portion and transmitting the input signal to the audio output transformer; and
  configuring an equalizer for enhanced sound quality at the audio pre-amplifying portion, the equalizer for enhanced sound quality correcting high-frequency and low-frequency responses of the input signal; wherein the equalizer for enhanced sound quality is a CR-type equalizer and includes an input and an output, wherein the input is connected to a first terminal of a first resistor and a first terminal of a first capacitor; a second terminal of the first resistor is connected to a first terminal of a second capacitor and a first terminal of a third capacitor; a first variable resistor having a first center tap is connected between a second terminal of the first capacitor and a second terminal of the second capacitor, the first center tap being the output a second variable resistor is connected between the second terminal of the second capacitor and a second terminal of the third capacitor, the second variable resistor having a second center tap connected to the second terminal of the second capacitor; the second terminal of the third capacitor is connected to a first terminal of a second resistor; and a second terminal of the second resistor is connected to a signal ground terminal of the audio output transforming portion.

14. The adjustment method of claim 13, wherein the equalizer for enhanced sound quality corrects a high-frequency response of 2 kHz-20 kHz and a low-frequency response of 20 Hz-500 Hz.

15. The adjustment method of claim 14, wherein the E-shaped silicon steel sheets and the I-shaped silicon steel sheets are non-oriented H50 silicon steel sheets.

16. The adjustment method of claim 13, wherein the input of the equalizer for enhanced sound quality is connected to a first-stage vacuum tube pre-amplifier circuit and the output of the equalizer for enhanced sound quality is connected to a second-stage vacuum tube pre-amplifier circuit.

17. The adjustment method of claim 16, wherein the E-shaped silicon steel sheets and the I-shaped silicon steel sheets are non-oriented H50 silicon steel sheets.

18. The adjustment method of claim 13, comprising adjusting the first variable resistor to correct the high-frequency response of the input signal.

19. The adjustment method of claim 18, wherein the E-shaped silicon steel sheets and the I-shaped silicon steel sheets are non-oriented H50 silicon steel sheets.

20. The adjustment method of claim 13, comprising adjusting the second variable resistor to correct the low-frequency response of the input signal.

21. The adjustment method of claim 20, wherein the E-shaped silicon steel sheets and the I-shaped silicon steel sheets are non-oriented H50 silicon steel sheets.

22. The adjustment method of claim 13, wherein the E-shaped silicon steel sheets and the I-shaped silicon steel sheets are non-oriented H50 silicon steel sheets.

* * * * *